United States Patent
Lee et al.

(10) Patent No.: US 10,424,627 B2
(45) Date of Patent: Sep. 24, 2019

(54) ORGANIC LIGHT-EMITTING DISPLAY DEVICE AND METHOD OF MANUFACTURING THE SAME

(71) Applicant: Samsung Display Co., Ltd., Yongin-si (KR)

(72) Inventors: Joongu Lee, Yongin-si (KR); Jaesik Kim, Yongin-si (KR); Jaeik Kim, Yongin-si (KR); Yeonhwa Lee, Yongin-si (KR); Sehoon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/834,108

(22) Filed: Dec. 7, 2017

(65) Prior Publication Data

US 2018/0315806 A1    Nov. 1, 2018

(30) Foreign Application Priority Data

Apr. 28, 2017  (KR) ........................ 10-2017-0055753

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3211* (2013.01); *H01L 51/5212* (2013.01); *H01L 51/5253* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 6,146,715 A | 11/2000 | Kim et al. |
| 8,599,113 B2 | 12/2013 | Lhee et al. |
| 2002/0014836 A1 | 2/2002 | Codama et al. |
| 2012/0181554 A1 | 7/2012 | Irving et al. |

(Continued)

FOREIGN PATENT DOCUMENTS

| JP | 2000-012220 | 1/2000 |
| KR | 10-2010-0052059 | 5/2010 |

*Primary Examiner* — Michelle Mandala
(74) *Attorney, Agent, or Firm* — H.C. Park & Associates, PLC

(57) ABSTRACT

An organic light-emitting display device includes a first pixel electrode, a second pixel electrode, a pixel-defining layer disposed on the first pixel electrode and the second pixel electrode and exposing at least portions of the first pixel electrode and the second pixel electrode, a first stack disposed on the exposed portion of the first pixel electrode, a first protective layer, a second stack disposed on the exposed portion of the second pixel electrode, and a first inorganic conductive layer. The first stack includes a first intermediate layer including an emission layer and a first opposite electrode on the first intermediate layer. The first protective layer is disposed on the first stack. The second stack includes a second intermediate layer including an emission layer and a second opposite electrode on the second intermediate layer. The first inorganic conductive layer is disposed between the second pixel electrode and the second stack.

20 Claims, 16 Drawing Sheets

(56) References Cited

U.S. PATENT DOCUMENTS

2015/0137081 A1* 5/2015 Kim .................... H01L 27/3211
                                                        257/40
2016/0247863 A1* 8/2016 Choung ............. H01L 27/3246

* cited by examiner

ORGANIC LIGHT-EMITTING DISPLAY DEVICE AND METHOD OF MANUFACTURING THE SAME

CROSS-REFERENCE TO RELATED APPLICATION

This application claims priority from and the benefit of Korean Patent Application No. 10-2017-0055753, filed on Apr. 28, 2017, which is hereby incorporated by reference for all purposes as if fully set forth herein.

BACKGROUND

Field

The invention relates generally to an organic light-emitting display device and a method of manufacturing the same, and more particularly, to an organic light-emitting display device and a method of manufacturing the same having improved display quality.

Discussion of the Background

An organic light-emitting display device includes pixels, each of the pixels including an organic light-emitting diode. The organic light-emitting diode includes a pixel electrode, an electrode disposed opposite the pixel electrode known in the art and herein as an "opposite electrode", and an emission layer interposed between the pixel electrode and the opposite electrode.

In an organic light-emitting display device capable of reproducing full colors, light of different colors is emitted by each pixel region, and an emission layer of each pixel and an opposite electrode integrally formed with a plurality of pixels may be formed using a deposition mask. As the resolution of organic light-emitting display devices has gradually increased, the width of an open slit of a mask used during a deposition process has been gradually reduced and it is also required to reduce dispersion thereof even further. Also, to manufacture a high resolution organic light-emitting display device, it is required to reduce or remove a shadow effect. Accordingly, the deposition process may be performed while a substrate and mask are in close contact with each other.

However, in the case of performing the deposition process while the substrate and the mask are contacting each other, a defect (e.g., a mask stab phenomenon) occurs. To prevent this, a method of arranging a spacer on a pixel-defining layer may be used. However, in this method, the additional process step of arranging the spacer is required and the thickness of an organic light-emitting display device increases due to the spacer.

The above information disclosed in this Background section is only for enhancement of understanding of the background of the inventive concepts, and, therefore, it may contain information that does not form prior art.

SUMMARY

Organic light-emitting display devices and methods of manufacturing the same according to the principles of the invention are capable of improving display quality.

Additional aspects will be set forth in the detailed description which follows, and, in part, will be apparent from the disclosure, or may be learned by practice of the inventive concepts.

According to one aspect of the invention, an organic light-emitting display device includes: a first pixel electrode and a second pixel electrode; a pixel-defining layer disposed on the first pixel electrode and the second pixel electrode and exposing at least portions of the first pixel electrode and the second pixel electrode; a first stack disposed on the exposed portion of the first pixel electrode, the first stack including a first intermediate layer including an emission layer and a first opposite electrode disposed on the first intermediate layer; a first protective layer disposed on the first stack; a second stack disposed on the exposed portion of the second pixel electrode, the second stack including a second intermediate layer including an emission layer and a second opposite electrode disposed on the second intermediate layer; and a first inorganic conductive layer disposed between the second pixel electrode and the second stack.

The first protective layer and the first inorganic conductive layer may include the same material.

Each of the first protective layer and the first inorganic conductive layer may include at least one of a conductive oxide film and a metal thin film.

A width of the first protective layer may be greater than a width of the first stack.

An edge of the first protective layer may contact an upper surface of the pixel-defining layer.

A width of the first inorganic conductive layer may be equal to or greater than a width of an opening of the pixel-defining layer which exposes the second pixel electrode.

An edge of the first inorganic conductive layer may contact an inclined surface of the pixel-defining layer, the inclined surface being adjacent to the exposed portion of the second pixel electrode.

The edge of the first inorganic conductive layer may be spaced apart from an edge of the second pixel electrode by the pixel-defining layer.

The organic light-emitting display device may further include: a third pixel electrode; a third stack disposed on a portion of the third pixel electrode exposed by the pixel-defining layer, the third stack including a third intermediate layer including an emission layer and a third opposite electrode disposed on the third intermediate layer; and at least one inorganic conductive layer disposed between the third pixel electrode and the third stack.

The organic light-emitting display device may further include a second protective layer disposed on the second opposite electrode.

The at least one inorganic conductive layer may include a second inorganic conductive layer and a third inorganic conductive layer that are stacked on the third pixel electrode, and one of the second inorganic conductive layer and the third inorganic conductive layer may include the same material as the second protective layer.

The other of the second inorganic conductive layer and the third inorganic conductive layer may include the same material as the first protective layer The organic light-emitting display device may further include: a common opposite electrode covering the first stack and the second stack.

According to another aspect of the invention, an organic light-emitting display device includes: a first pixel electrode and a second pixel electrode; a first stack disposed on the first pixel electrode, the first stack including a first intermediate layer including an emission layer and a first opposite electrode disposed on the first intermediate layer; a second stack disposed on the second pixel electrode, the second stack including a second intermediate layer including an emission layer and a second opposite electrode disposed on the second intermediate layer; a common opposite electrode disposed on the first stack and the second stack, the common opposite electrode electrically connecting the first opposite electrode to the second opposite electrode; a first protective layer disposed between the first stack and the common opposite electrode, the first protective layer having a width greater than a width of the first stack; and a first conductive layer disposed between the second pixel electrode and the second stack.

The first conductive layer may include an inorganic material.

The first protective layer and the first conductive layer may include the same material.

The organic light-emitting display device may further include an insulating layer separating an edge of the first conductive layer from an edge of the second pixel electrode.

The organic light-emitting display device may further include a second protective layer covering the second stack.

The organic light-emitting display device may further include: a third pixel electrode spaced apart from the first pixel electrode and the second pixel electrode; a third stack disposed on the third pixel electrode, the third stack including a third intermediate layer including an emission layer and a third opposite electrode disposed on the third intermediate layer; and at least one conductive layer between the third pixel electrode and the third stack.

The at least one conductive layer may include the same material as at least one of the first protective layer and the second protective layer.

According to still another aspect of the invention, a method of manufacturing an organic light-emitting display device includes the steps of: preparing a substrate on which a first pixel electrode, a second pixel electrode, and a third pixel electrode are disposed; forming a pixel-defining layer on the substrate to expose at least portions of the first pixel electrode, the second pixel electrode, and the third pixel electrode; forming a first stack on the first pixel electrode by using a first masking pattern which has a first exposure hole overlapping the first pixel electrode, the first stack including a first intermediate layer including an emission layer and a first opposite electrode disposed on the first intermediate layer; removing the first masking pattern; forming a protective material layer covering the first stack, the second pixel electrode, and the third pixel electrode; forming a first protective layer covering the first stack by etching the protective material layer; forming a second stack on the second pixel electrode by using a second masking pattern which has a second exposure hole overlapping the second pixel electrode, the second stack including a second intermediate layer including an emission layer and a second opposite electrode disposed on the second intermediate layer; and removing the second masking pattern, wherein the step of forming of the first protective layer includes forming a conductive layer on at least one of the second pixel electrode and the third pixel electrode by etching the protective material layer.

An edge of the first protective layer may contact an upper surface of the pixel-defining layer.

The first protective layer and the conductive layer may include at least one of a conductive oxide film and a metal thin film.

A width of the conductive layer may be greater than a width of an opening of the pixel-defining layer which exposes at least one of the second pixel electrode and the third pixel electrode.

An edge of the conductive layer may contact the pixel-defining layer.

The pixel-defining layer may separate an edge of the conductive layer from an edge of one of the second pixel electrode and the third pixel electrode on which the conductive layer is disposed.

The method may further include forming a common opposite electrode covering the first stack, the first protective layer, and the second stack.

At least one of the first masking pattern and the second masking pattern may include a protective resin layer and a photoresist layer disposed on the protective resin layer.

The protective resin layer may include a fluorine-based resin.

According to the principles and exemplary embodiments of the invention, the first protective layer is disposed on the first stack, and the first inorganic conductive layer is disposed between the second pixel electrode and the second stack. The first protective layer may protect the first stack in various processes, e.g., from harmful etchants, thereby improving uniform light emission. Furthermore, the first inorganic conductive layer may increase an emission area of the second stack and may protect the second pixel electrode in various processes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
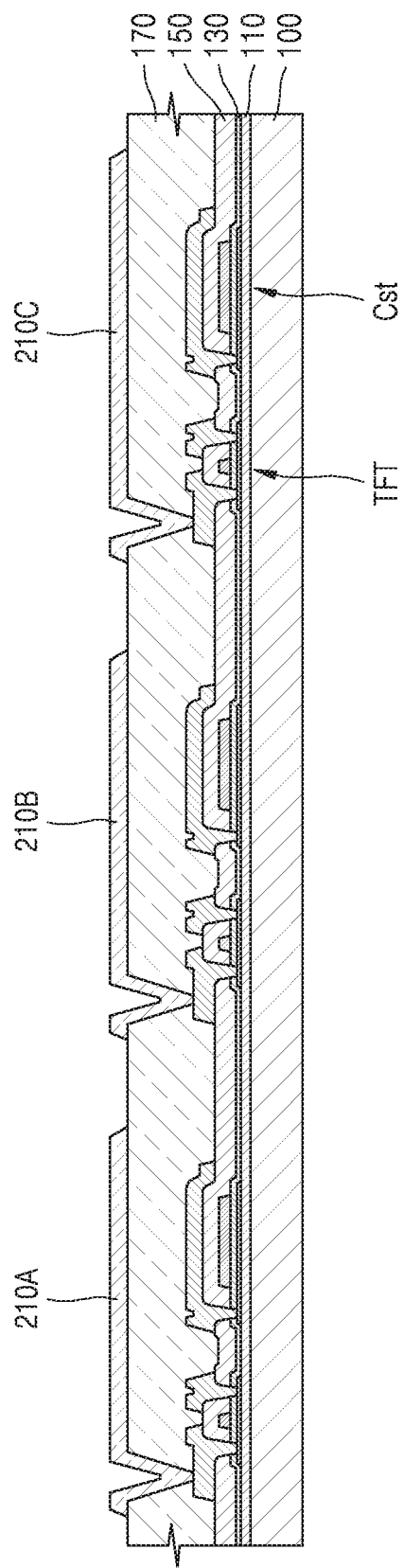
FIGS. 1 to 14 are cross-sectional views illustrating an exemplary embodiment of organic light-emitting display device at various stages of manufacture according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 15:
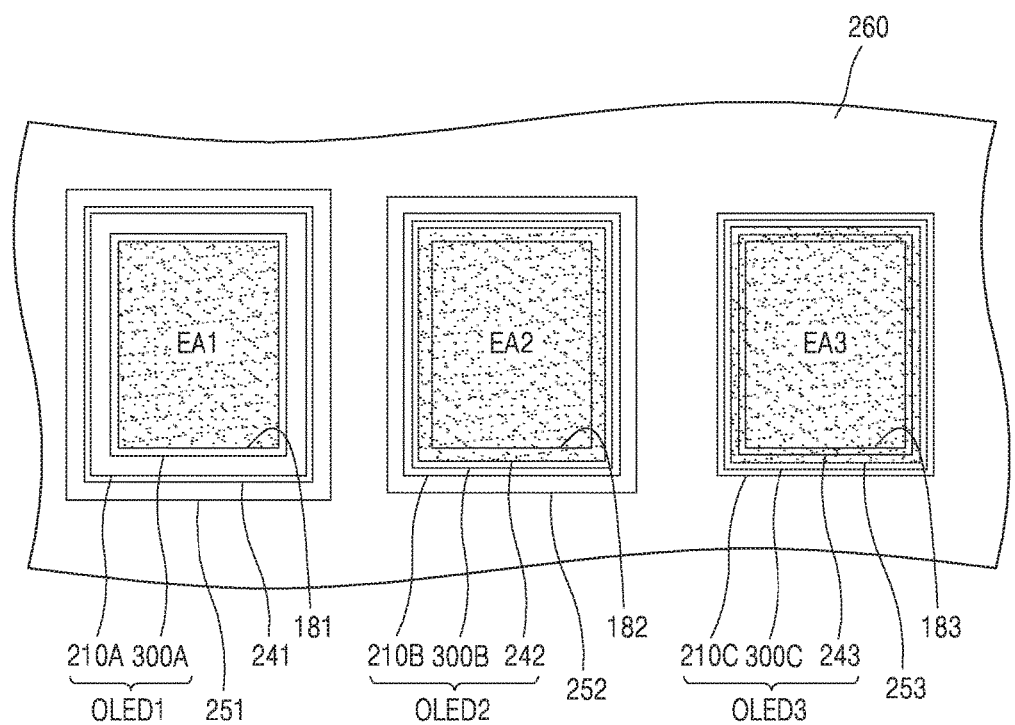
FIG. 15 is a plan view of a portion of the organic light-emitting display device of FIG. 14, viewed in the direction indicated by arrow K in FIG. 14.
Figure 16:
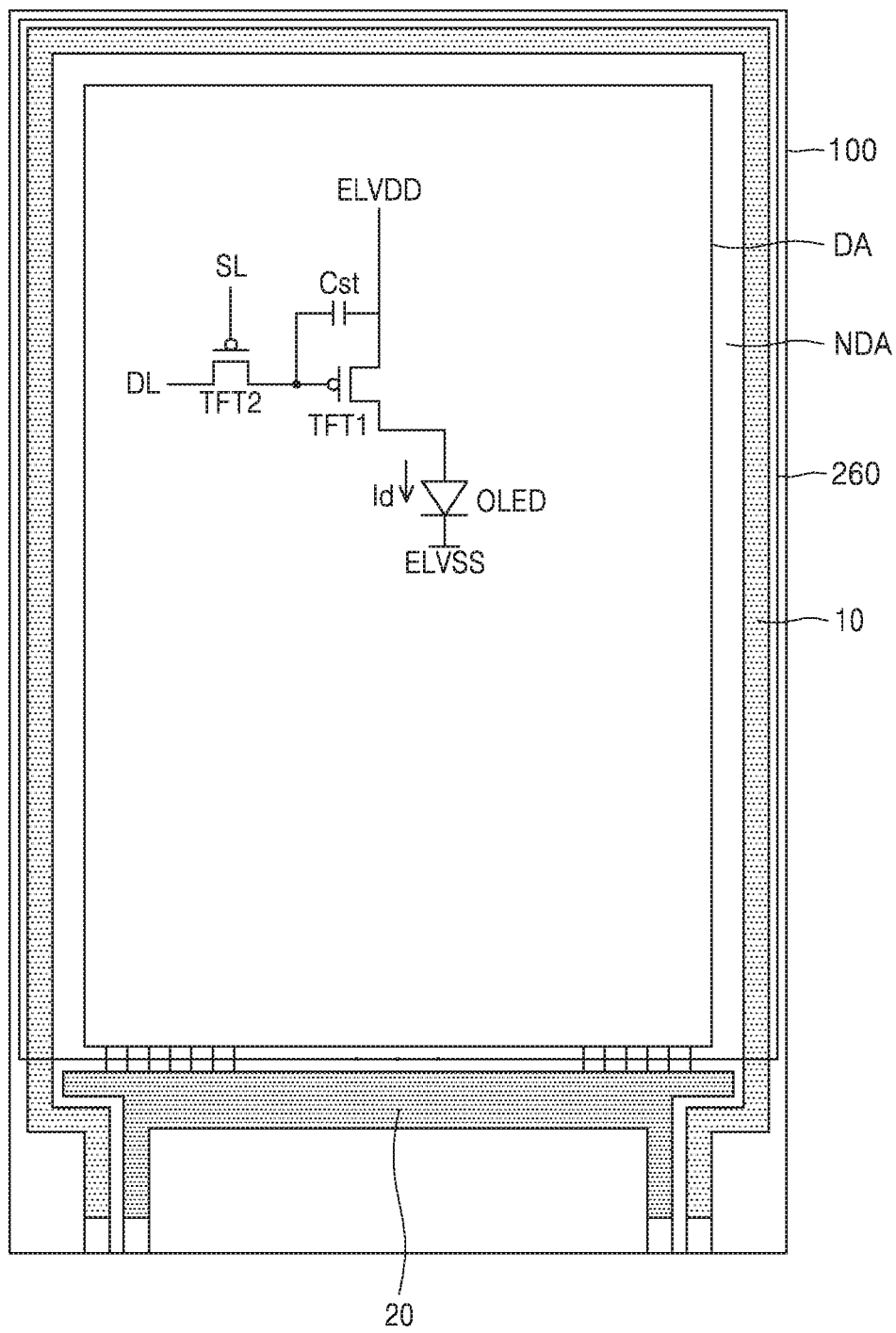
FIG. 16 is a plan view of an exemplary embodiment of an organic light-emitting display device constructed according to the principles of the invention.

FIGS. 1 to 14 are cross-sectional views illustrating an exemplary embodiment of organic light-emitting display device at various stages of manufacture according to the principles of the invention. FIG. 15 is a plan view of a portion of the organic light-emitting display device of FIG. 14, viewed in the direction indicated by arrow K in FIG. 14. FIG. 16 is a plan view of an exemplary embodiment of an organic light-emitting display device constructed according to the principles of the invention.

Referring to FIG. 1, a first pixel electrode 210A, a second pixel electrode 210B, and a third pixel electrode 210C are formed. The first to third pixel electrodes 210A, 210B, and 210C may be formed on the same layer. For example, the first to third pixel electrodes 210A, 210B, and 210C may be formed on a planarization insulating layer 170.

Various layers may be formed before the first to third pixel electrodes 210A, 210B, and 210C are formed. In FIG. 1, a thin film transistor TFT and a storage capacitor Cst are formed on a substrate 100, the planarization insulating layer 170 covering the thin film transistor TFT and the storage capacitor Cst is formed, and then the pixel electrodes 210A, 210B, and 210C are formed on the planarization insulating layer 170.

The substrate 100 may include any one of various materials such as a glass material, a metal material, or a plastic material such as polyethylene terephthalate (PET), polyethylene naphthalate (PEN), or polyimide. A buffer layer 110 for preventing impurities from penetrating into a semiconductor layer of the thin film transistor TFT, a gate insulating layer 130 for insulating the semiconductor layer of the thin film transistor TFT from a gate electrode, an interlayer insulating layer 150 for insulating a source electrode and a drain electrode of the thin film transistor TFT from the gate electrode, and the planarization insulating layer 170 covering the thin film transistor TFT and having a substantially flat top surface may be sequentially formed on the substrate 100.

The first to third pixel electrodes 210A, 210B, and 210C may be formed as transparent electrodes or semi-transparent electrodes. In this case, the first to third pixel electrodes 210A, 210B, and 210C may include, for example, indium tin oxide (ITO), indium zinc oxide (IZO), zinc oxide (ZnO), indium oxide ($In_2O_3$), indium gallium oxide (IGO), or aluminum zinc oxide (AZO). The first to third pixel electrodes 210A, 210B, and 210C also may be formed as reflective electrodes. In this case, the first to third pixel electrodes 210A, 210B, and 210C may include a reflective film formed of Ag, Mg, Al, Pt, Pd, Au, Ni, Nd, Ir, Cr, or a compound thereof and/or a film formed of ITO, IZO, ZnO, or $In_2O_3$ on the reflective film.

Figure 2:
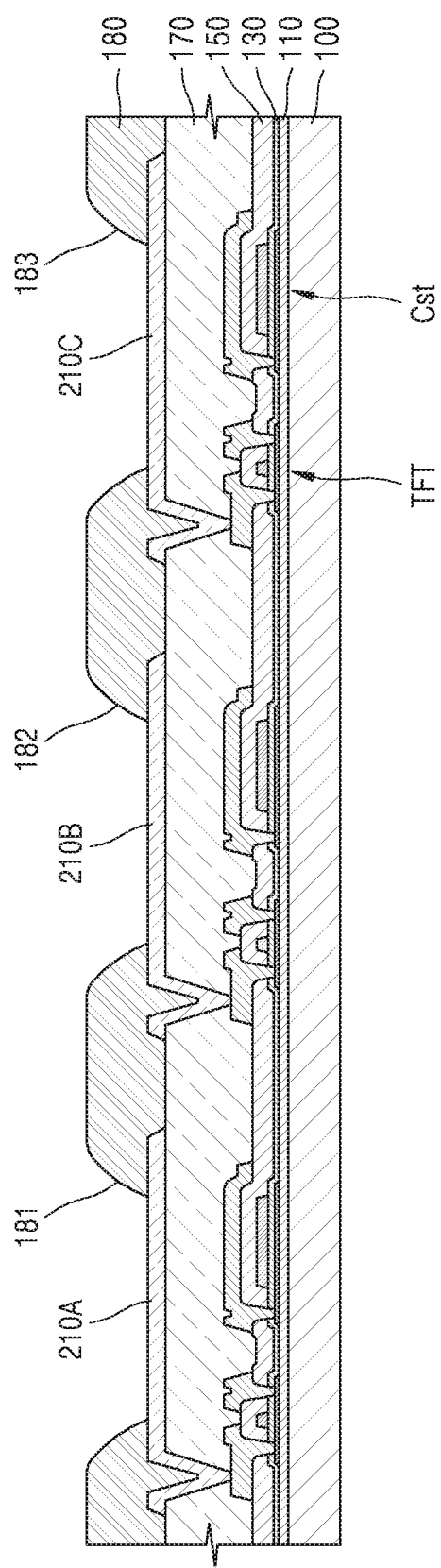

Referring to FIG. 2, a pixel-defining layer 180 is formed to expose at least a portion of each of the first to third pixel electrodes 210A, 210B, and 210C. The pixel-defining layer 180 includes openings 181, 182 and 183 exposing at least portions of the first to third pixel electrodes 210A, 210B, and 210C to define sub-pixels. For example, the openings 181, 182, and 183 may expose the central portions of the first to third pixel electrodes 210A, 210B, and 210C. In addition, the pixel-defining layer 180 may prevent an arc from being generated at ends of the first to third pixel electrodes 210A, 210B, and 210C by increasing the distances between the ends of the first to third pixel electrodes 210A, 210B, and 210C and first to third opposite electrodes and/or a common opposite electrode to be formed in subsequent processes.

Figure 3:
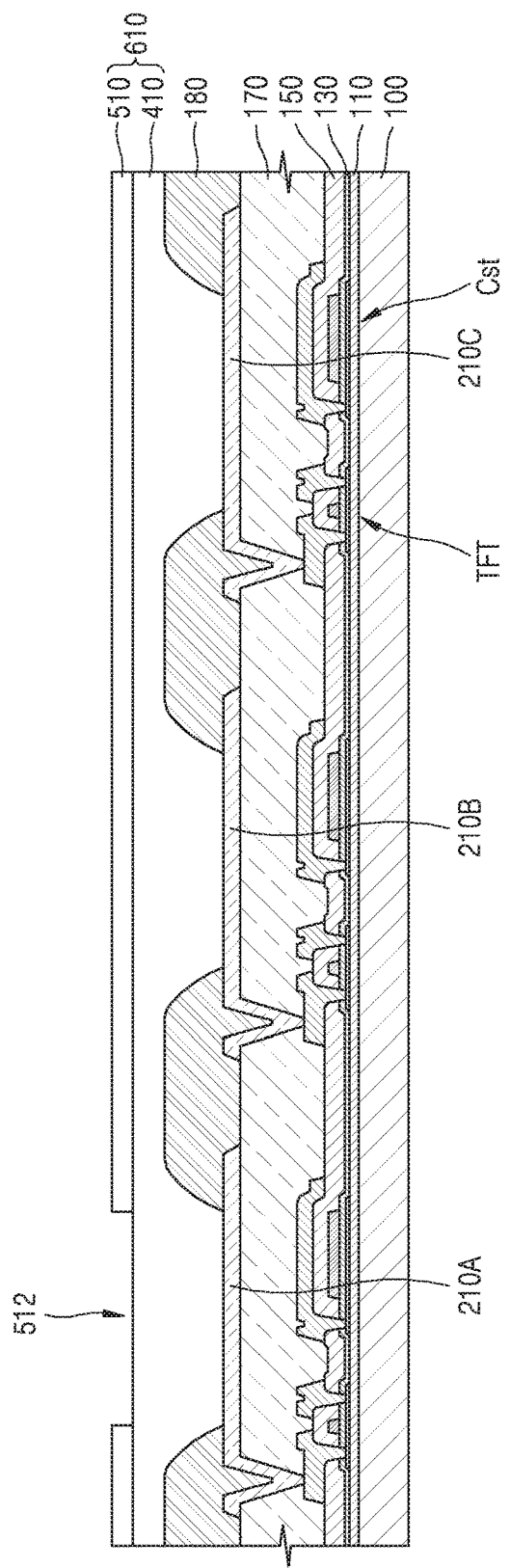

Referring to FIG. 3, a protective resin layer 410 is formed on the substrate 100 on which the first to third pixel electrodes 210A, 210B, and 210C are formed, and a photoresist layer 510 is formed on the protective resin layer 410. The protective resin layer 410 may include, for example, a fluorine-based material having a fluorine content of about 50 wt % or more. However, the exemplary embodiments are not limited thereto. The photoresist layer 510 may include a positive photosensitive material.

Thereafter, a region of the photoresist layer 510 overlapping the first pixel electrode 210A may be partially exposed and developed to form a first opening region 512.

Figure 4:
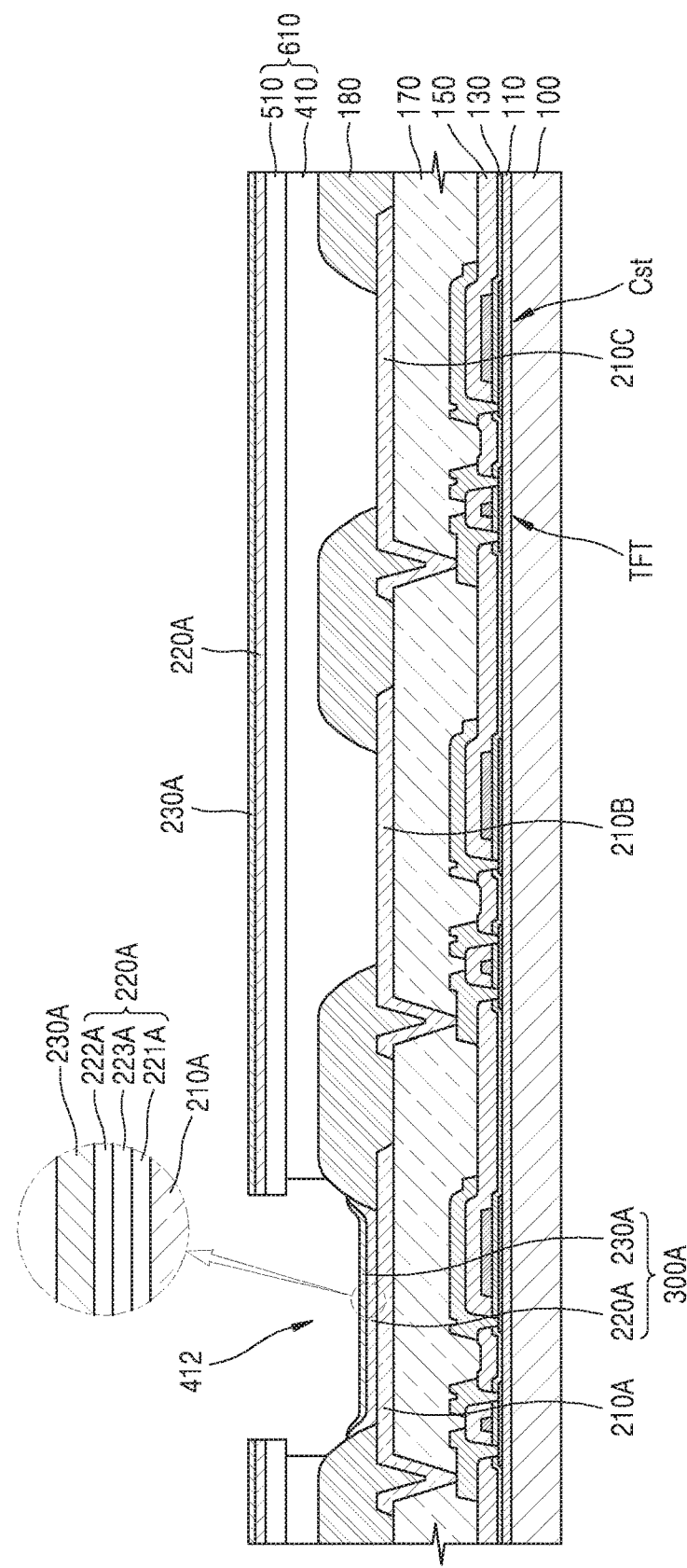

Referring to FIG. 4, a first exposure hole 412 exposing the first pixel electrode 210A may be formed by etching the protective resin layer 410 exposed through the first opening region 512. For example, the first exposure hole 412 may be formed by wet-etching the protective resin layer 410 by using a stripper (for example, a stripper including hydrofluoroether) capable of selectively removing the protective resin layer 410. The first exposure hole 412 may be wider than the first opening region 512. The protective resin layer 410 and the photoresist layer 510 may form a first masking pattern 610.

A first intermediate layer 220A and a first opposite electrode 230A are sequentially formed on the substrate 100 having the first masking pattern 610 formed thereon. The first intermediate layer 220A and the first opposite electrode 230A may be formed by a thermal evaporation method. A stack structure 300A (hereinafter referred to as a first stack) including the first intermediate layer 220A and the first opposite electrode 230A may be formed on the first pixel electrode 210A through the first exposure hole 412. The first intermediate layer 220A and the first opposite electrode 230A may also be formed on the first masking pattern 610.

The first intermediate layer 220A includes an emission layer 223A, as shown in an enlarged view of FIG. 4. The emission layer 223A may include a fluorescent material or a phosphorescent material capable of emitting light of a first color (e.g., red). First and second functional layers 221A and 222A may be formed above and/or below the emission layer 223A.

The first functional layer 221A may be a single layer or a multilayer. For example, when the first functional layer 221A is formed of a polymer material, the first functional layer 221A may be a single layer of a hole transport layer (HTL), and may include poly-(3,4)-ethylene-dihydroxy thiophene (PEDOT) or polyaniline (PANI). When the first functional layer 221A is formed of a low molecular material, the first functional layer 221A may include a hole injection layer (HIL) and a hole transport layer (HTL).

The second functional layer 222A may be formed on the emission layer 223A to cover the emission layer 223A. It is not always necessary to form the second functional layer 222A. For example, when the first functional layer 221A and the emission layer 223A are formed of a polymer material, the second functional layer 222A may be omitted. When the first functional layer 221A and the emission layer 223A are formed of a low molecular material, the second functional layer 222A may be formed in order to improve characteristics of the organic light-emitting device. In this case, the second functional layer 222A may have a single layered or multilayered structure, and the second functional layer 222A may include an electron transport layer (ETL) and/or an electron injection layer (EIL).

The first opposite electrode 230A may be formed as a transparent electrode or a semi-transparent electrode. In this case, the first opposite electrode 230A may include Ag, Mg, Al, Yb, Ca, Li, Au, or a compound thereof, or may include a transparent or semi-transparent material such as ITO, IZO, ZnO, or $In_2O_3$. In an exemplary embodiment, the first opposite electrode 230A may include a metal thin film including Ag and Mg. The first opposite electrode 230A also may be formed as a reflective electrode. In this case, the first opposite electrode 230A may include at least one of Li, Ca, LiF/Ca, LiF/Al, Al, Ag and Mg.

Figure 5:
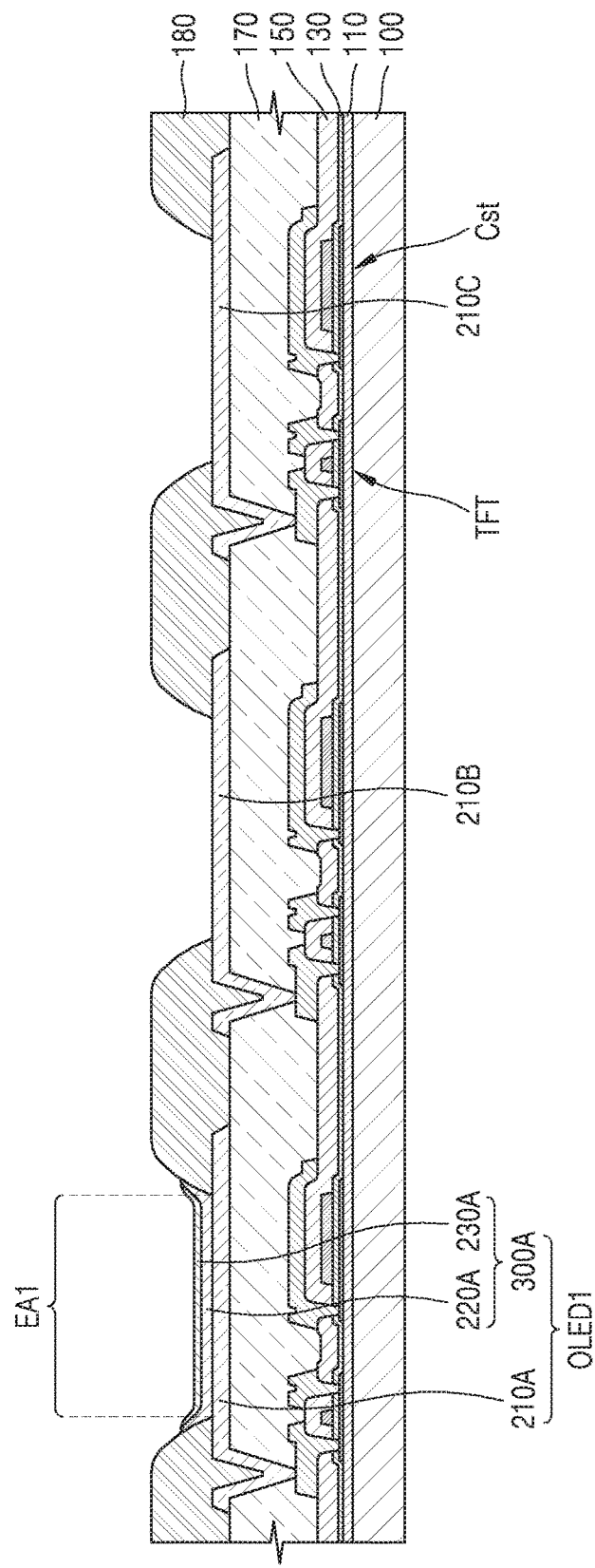

Referring to FIG. 5, the first masking pattern 610 shown in FIG. 4 is removed through a lift-off process. The layers stacked on the first masking pattern 610 may be removed as well. For example, when the protective resin layer 410 of FIG. 4 is removed using a fluorine-based solvent, the photoresist layer 510, the first intermediate layer 220A, and the first opposite electrode 230A, stacked on the protective resin layer 410, may be removed together with the protective resin layer 410.

The first pixel electrode 210A and the first stack 300A form a first organic light-emitting diode OLED1. The first organic light-emitting diode OLED1 emits light of a first color, and a first emission area EA1 where light of the first color is emitted corresponds to a first sub-pixel.

Figure 6:
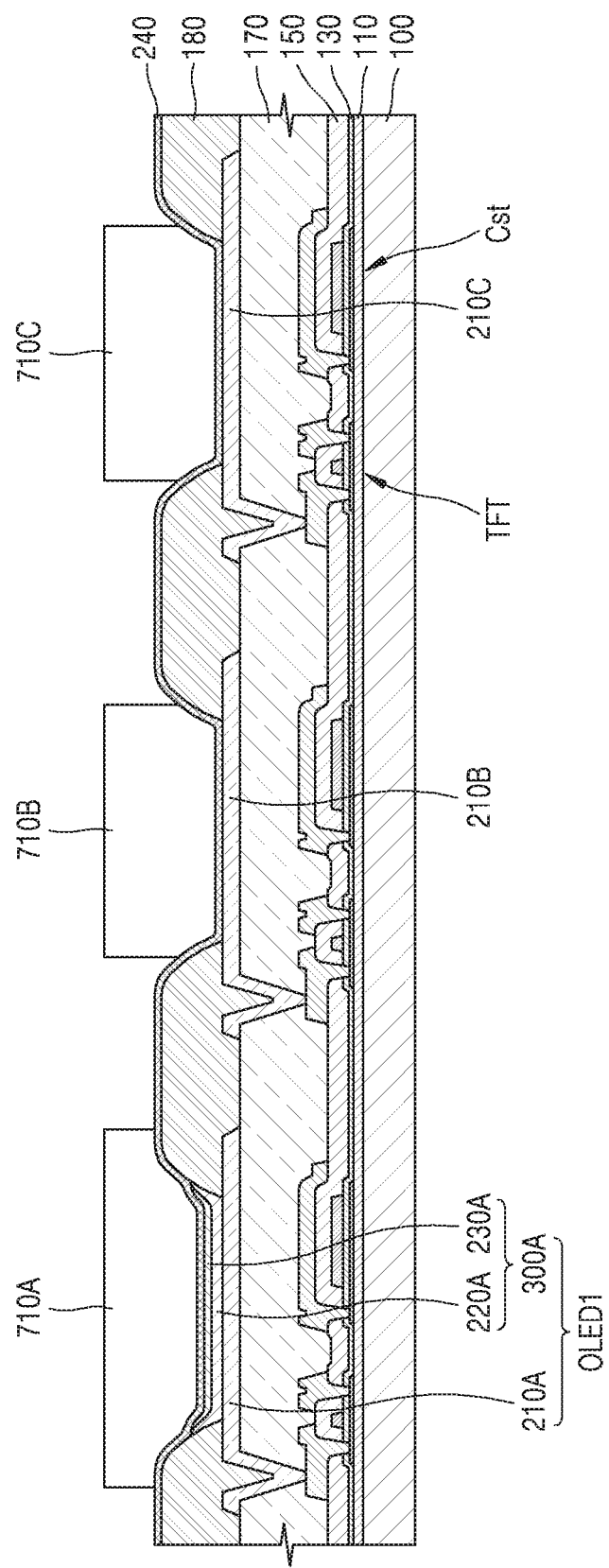

Referring to FIG. 6, a first protective material layer 240 is formed on the substrate 100 on which the first stack 300A is formed. The first protective material layer 240 may cover the substrate 100 on which the first to third pixel electrodes 210A, 210B, and 210C are formed.

The first protective material layer 240 may include an inorganic material having conductivity. For example, the first protective material layer 240 may include at least one of a conductive oxide film including ITO, IZO, or AZO, and a metal thin film including Ag, Mg, Al, Yb, Ca, Li, Au, or a compound thereof.

Thereafter, first to third photoresist patterns 710A, 710B, and 710C overlapping the first to third pixel electrodes 210A, 210B, and 210C, respectively, are formed, and a region of the first protective material layer 240, which is not protected by the first to third photoresist patterns 710A, 710B, and 710C, is etched, for example, by a wet etching process.

Figure 7:
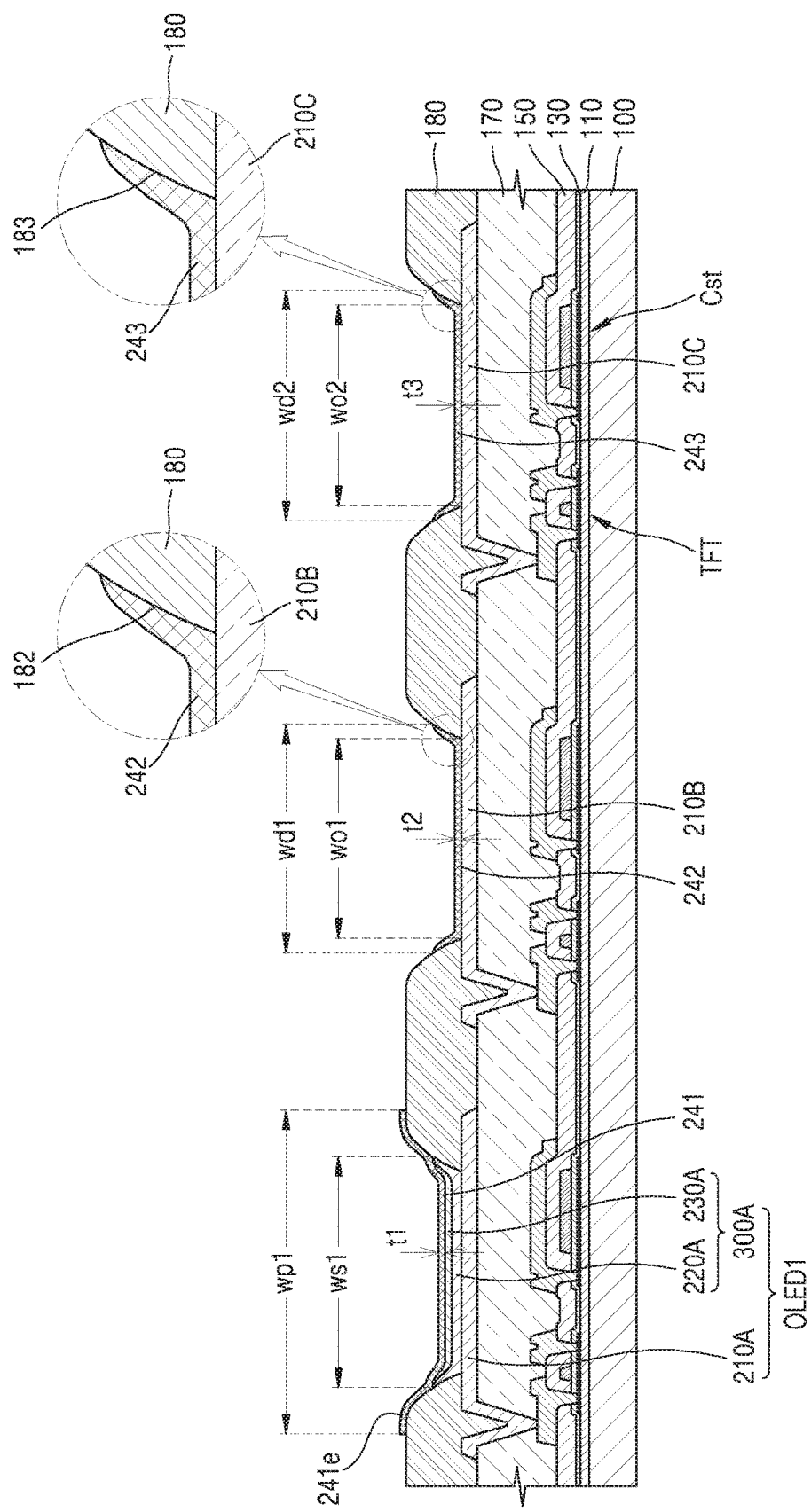

Referring to FIG. 7, through the etching process, a first protective layer 241, a first inorganic conductive layer (or a first conductive layer) 242, and a second inorganic conductive layer (or a second conductive layer) 243 may be formed on the first stack 300A, the second pixel electrode 210B, and the third pixel electrode 210C, respectively. Since the first protective layer 241, the first inorganic conductive layer 242, and the second inorganic conductive layer 243 are formed by patterning the first protective material layer 240 shown in FIG. 6, these layers may include the same material.

The first protective layer 241 may protect the first stack 300A in subsequent manufacture processes. For instance, the first protective layer 241 may protect the first stack 300A from a solvent that is used to form a second exposure hole 422 of a second masking pattern 620 (see FIG. 8) in a process to be described later or is used in a lift-off process for the second masking pattern 620. Therefore, occurrence of a dark spot, which may occur as the edge of the first stack 300A is damaged during a lift-off process if the first protective layer 241 is not present, may be prevented or at least minimized, thereby improving uniformity of light emission of pixels.

The first protective layer 241 may cover the first stack 300A. As such, a width wp1 of the first protective layer 241 may be greater than a width ws1 of the first stack 300A. An edge 241e of the first protective layer 241 may extend to an upper surface of the pixel-defining layer 180 and directly contact the upper surface of the pixel-defining layer 180.

The first inorganic conductive layer 242 overlaps the second pixel electrode 210B and may directly contact the second pixel electrode 210B. A width wd1 of the first inorganic conductive layer 242 may be equal to or greater than a width wo1 of an opening 182 of the pixel-defining layer 180 that exposes the second pixel electrode 210B. The width wd1 of the first inorganic conductive layer 242 may be determined according to the width of the second photoresist pattern 710B described above with reference to FIG. 6.

The first inorganic conductive layer 242 is formed in the opening 182 of the pixel-defining layer 180. As shown in an enlarged view of FIG. 7, the edge of the first inorganic conductive layer 242 may directly contact a surface (e.g., an inclined surface) of the pixel-defining layer 180 adjacent to the opening 182. The edge of the first inorganic conductive layer 242 and the edge of the second pixel electrode 210B are spaced apart from each other by the pixel-defining layer 180 interposed therebetween.

The second inorganic conductive layer 243 overlaps the third pixel electrode 210C and may directly contact the third pixel electrode 210C. A width wd2 of the second inorganic conductive layer 243 may be equal to or greater than a width wo2 of an opening 183 of the pixel-defining layer 180 that exposes the third pixel electrode 210C. The width wd2 of the second inorganic conductive layer 243 may be determined according to the width of the third photoresist pattern 710C described above with reference to FIG. 6.

The second inorganic conductive layer 243 is formed in the opening 183 of the pixel-defining layer 180. As shown in an enlarged view of FIG. 7, the edge of the second inorganic conductive layer 243 may directly contact a surface (e.g., an inclined surface) of the pixel-defining layer 180 adjacent to the opening 183. The edge of the second inorganic conductive layer 243 and the edge of the third pixel electrode 210C are spaced apart from each other by the pixel-defining layer 180 interposed therebetween.

In subsequent manufacture processes, the first and second inorganic conductive layers 242 and 243 may protect the second and third pixel electrodes 210B and 210C disposed below the first and second inorganic conductive layers 242 and 243, respectively. If portions of the first protective material layer 240 corresponding to the first and second inorganic conductive layers 242 and 243 were not present during etching of the first protective material layer 240 to form the first protective layer 241, the second and third pixel electrodes 210B and 210C may be damaged by an etchant for etching the first protective material layer 240. However, in the illustrated embodiment, since the first and second inorganic conductive layers 242 and 243 are formed to cover the second and third pixel electrodes 210B and 210C, respectively, and the second and third pixel electrodes 210B and 210C may be protected from the etchant when etching the first protective material layer 240.

The first protective layer 241, the first inorganic conductive layer 242, and the second inorganic conductive layer 243 may be formed by the same deposition method in the same process. Therefore, a thickness t1 of the first protective layer 241 corresponding to the center of the first pixel electrode 210A, a thickness t2 of the first inorganic conductive layer 242 corresponding to the center of the second pixel electrode 210B, and a thickness t3 of the second inorganic conductive layer 243 corresponding to the center of the third pixel electrode 210C may be substantially equal to each other. On the other hand, thicknesses of edge portions of the first protective layer 241, the first inorganic conductive layer 242, and the second inorganic conductive layer 243 may vary depending on inclined surfaces of the pixel defining layer 180 adjacent to the openings 181, 182, and 183.

Figure 8:
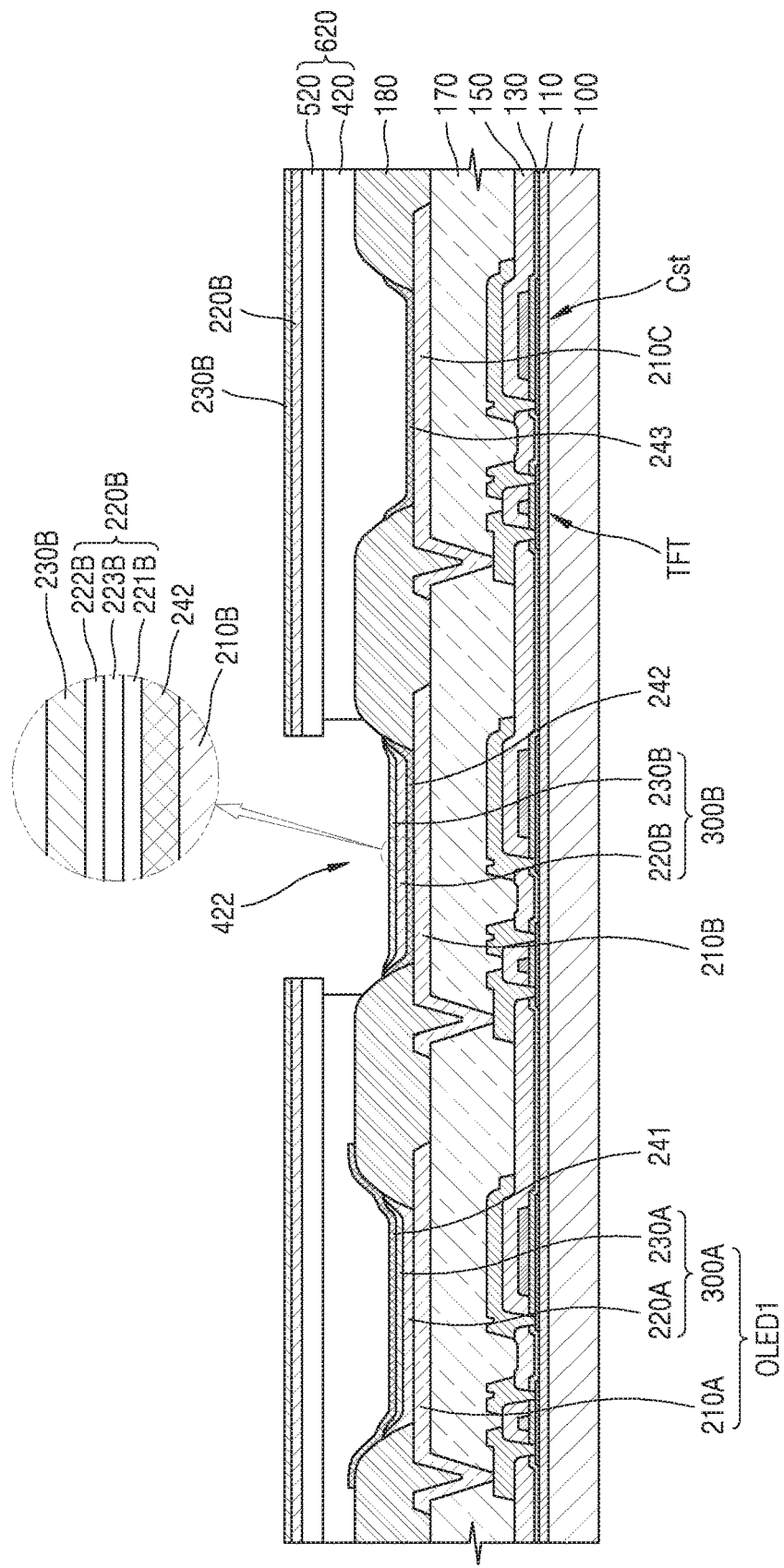

Referring to FIG. 8, a protective resin layer 420 is formed on the substrate 100 on which the first protective layer 241, the first inorganic conductive layer 242 and the second inorganic conductive layer 243 are formed, and a photoresist layer 520 is formed on the protective resin layer 420. The protective resin layer 420 may include, for example, a fluorine-based material having a fluorine content of about 50 wt % or more, and the photoresist layer 520 may include a positive photosensitive material.

A second opening region may be formed by partially exposing and developing a region of the photoresist layer 520 overlapping the second pixel electrode 210B, and a second exposure hole 422 may be formed by etching the protective resin layer 420 exposed through the second opening region. The protective resin layer 420 including the second exposure hole 422 and the photoresist layer 520 may form a second masking pattern 620.

A second intermediate layer 220B and a second opposite electrode 230B are sequentially formed on the substrate 100 on which the second masking pattern 620 is formed. The second intermediate layer 220B and the second opposite electrode 230B may be formed by a thermal evaporation method, and a stack structure 300B (hereinafter referred to as a second stack) including the second intermediate layer 220B and the second opposite layer 230B may be formed on the first inorganic conductive layer 242 through the second exposure hole 422. The second intermediate layer 220B and the second opposite electrode 230B may also be formed on the second masking pattern 620.

The second intermediate layer 220B includes an emission layer 223B, as shown in an enlarged view of FIG. 8. The emission layer 223B may include a fluorescent material or a phosphorescent material capable of emitting light of a second color (e.g., green). First and second functional layers 221B and 222B may be formed above and/or below the emission layer 223B.

The first functional layer 221B may be a single layer or a multilayer. For example, the first functional layer 221B may be a single layer of a hole transport layer (HTL), or may be a multilayer including a hole injection layer (HIL) and the hole transport layer (HTL).

The second functional layer 222B may be formed on the emission layer 223B to cover the emission layer 223B. The second functional layer 222B may include an electron transport layer (ETL) and/or an electron injection layer (EIL). However, it is not always necessary to form the second functional layer 222B. For example, when the first functional layer 221B and the emission layer 223B are formed of a polymer material, the second functional layer 222B may be omitted.

The second opposite electrode 230B may be formed as a transparent electrode, a semi-transparent electrode, or a reflective electrode, and the material of the second opposite electrode 230B is the same as that of the first opposite electrode 230A.

Figure 9:
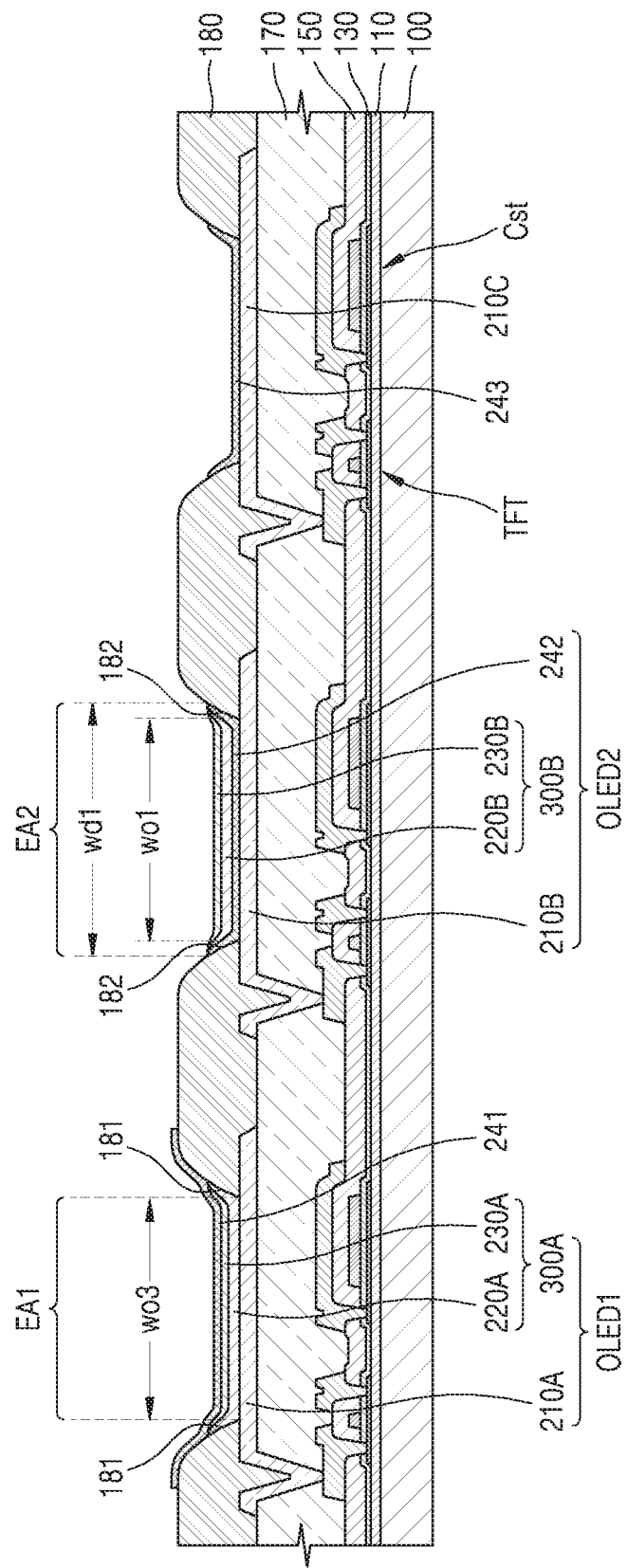

Referring to FIG. 9, the second masking pattern 620 shown in FIG. 8 is removed through a lift-off process. For example, the photoresist layer 520, the second intermediate layer 220B, and the second opposite electrode 230B, stacked on the protective resin layer 420 in FIG. 8, may be removed together by removing the protective resin layer 420 by using a fluorine-based solvent.

The second pixel electrode 210B, the first inorganic conductive layer 242, and the second stack 300B form a second organic light-emitting diode OLED2. Since the first inorganic conductive layer 242 has conductivity, holes emitted from the second pixel electrode 210B may be injected into the second intermediate layer 220B. The holes injected from the second pixel electrode 210B and electrons injected from a common opposite electrode 260 (See FIG. 14) through the second opposite electrode 230B are combined in the emission layer 223B of the second intermediate layer 220B and thus excitions are formed, and light of the second color may be emitted as the excitons drop from an excited state to a ground state. A second emission area EA2 where the light of the second color is emitted corresponds to a second sub-pixel.

The width of the first emission area EA1 of the first sub-pixel may be substantially equal to the width wo3 of the opening 181 of the pixel-defining layer 180 corresponding to the first sub-pixel. On the other hand, since the first inorganic conductive layer 242 may be a kind of additional pixel electrode that injects holes emitted from the second pixel electrode 210B into the second intermediate layer 220B, the width of the second emission area EA2 of the second sub-pixel may be substantially equal to the width wd1 of the first inorganic conductive layer 242, which is wider than the width wo1 of the opening 182 of the pixel-defining layer 180 corresponding to the second sub-pixel. Therefore, by increasing the width wd1 of the first inorganic conductive layer 242 without increasing the width wo1 of the opening 182 of the pixel-defining layer 180 corresponding to the second sub-pixel, the width of the second emission area EA2 may be increased.

Figure 10:
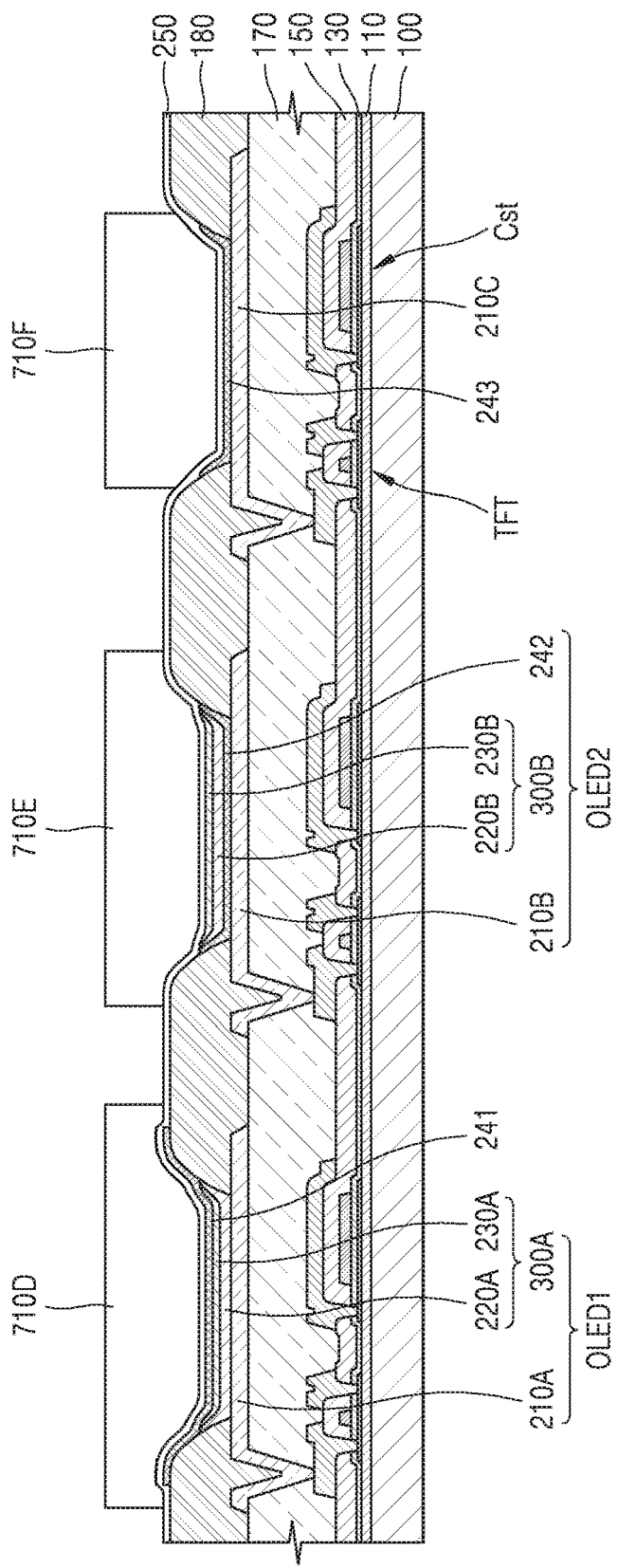

Referring to FIG. 10, a second protective material layer 250 is formed on the substrate 100 on which the second stack 300B is formed. The second protective material layer 250 may cover substantially all of the substrate 100 on which the first to third pixel electrodes 210A, 210B and 210C are formed.

The second protective material layer 250 may include an inorganic material having conductivity. The first protective material layer 240 may include at least one of a conductive oxide film including ITO, IZO, or AZO, and a metal thin film including Ag, Mg, Al, Yb, Ca, Li, Au, or a compound thereof.

Thereafter, fourth to sixth photoresist patterns 710D, 710E, and 710F overlapping the first to third pixel electrodes 210A, 210B, and 210C, respectively, are formed, and a region of the second protective material layer 250, which is not protected by the fourth to sixth photoresist patterns 710D, 710E, and 710F, is etched, for example, by a wet etching process.

Figure 11:
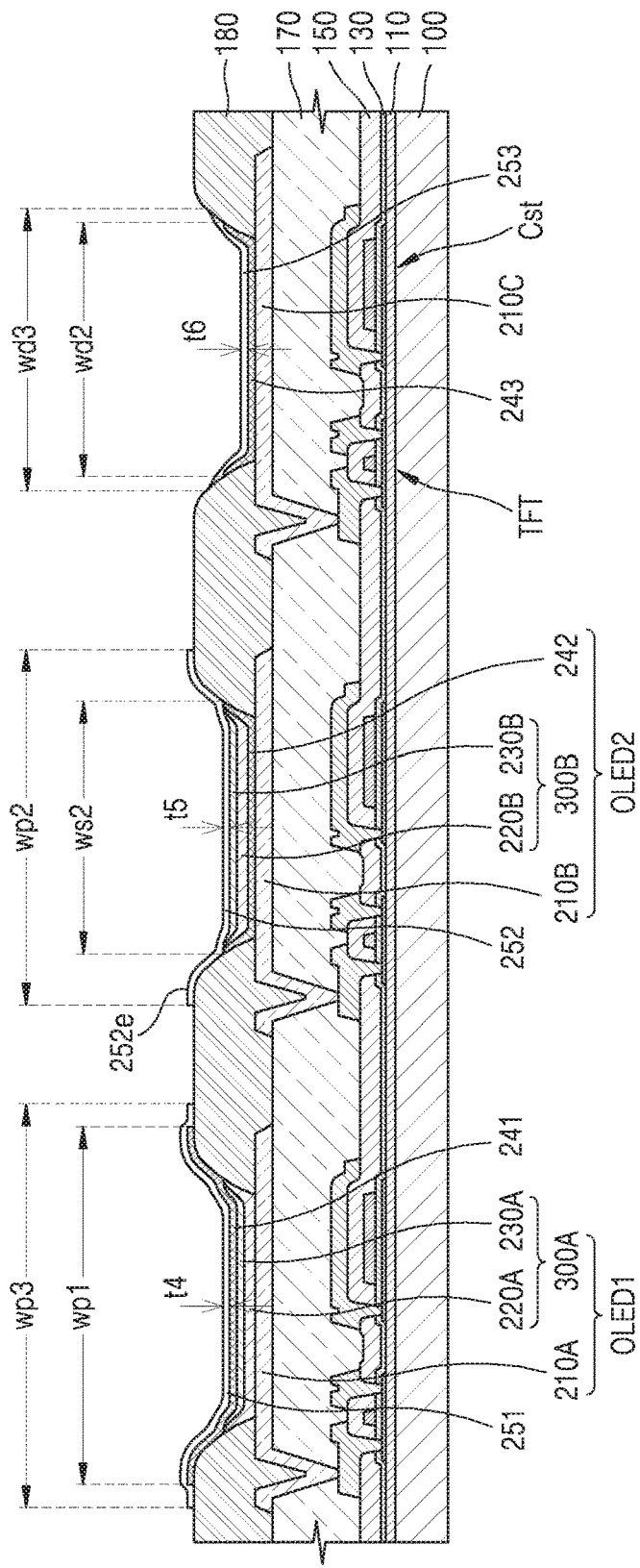

Referring to FIG. 11, through the etching of the second protective material layer 250 shown in FIG. 10, a second protective layer 252, a third inorganic conductive layer (or a third conductive layer) 253, and a third protective layer 251 is formed on the second stack 300B, the second inorganic conductive layer 243, and the first protective layer 241, respectively. Since the second protective layer 252, the third inorganic conductive layer 253, and the third protective layer 251 are formed by patterning the second protective material layer 250, these layers may include the same material.

The second protective layer 252 may protect the second stack 300B in subsequent manufacture processes. For example, the second protective layer 252 may protect the second stack 300B from a solvent that is used to form a third exposure hole 432 of a third masking pattern 630 (see FIG. 12) in a process to be described later or is used in a lift-off process for the third masking pattern 630. Therefore, a problem of a dark spot, which may occur as the edge of the second stack 300B is damaged by the solvent when the second protective layer 252 is not present may be prevented or at least minimized, thereby improving uniformity of light emission of pixels.

A width wp2 of the second protective layer 252 may be greater than a width ws2 of the second stack 300B to cover the second stack 300B. For example, an edge 252e of the second protective layer 252 may extend to an upper surface of the pixel-defining layer 180 and directly contact the upper surface of the pixel-defining layer 180.

The third inorganic conductive layer 253 overlaps the second inorganic conductive layer 243 on the third pixel electrode 210C and may directly contact the second inorganic conductive layer 243. A width wd3 of the third inorganic conductive layer 253 may be equal to or greater than the width wd2 of the second inorganic conductive layer 243. When the width wd3 of the third inorganic conductive layer 253 is formed to be greater than the width wd2 of the second inorganic conductive layer 243, the edge of the third inorganic conductive layer 253 may further extend to directly contact an inclined surface of the pixel-defining layer 180 past the edge of the second inorganic conductive layer 243 to improve step coverage on the pixel-defining layer 180. The edge of the third inorganic conductive layer 253 and the edge of the third pixel electrode 210C are spaced apart from each other by the pixel-defining layer 180 interposed therebetween.

The third protective layer 251 is formed on the first protective layer 241 and a width wp3 of the third protective layer 251 may be equal to or greater than a width wp1 of the first protective layer 241.

The second protective layer 252, the third inorganic conductive layer 253, and the third protective layer 251 may be formed by the same deposition method in the same process. Therefore, a thickness t4 of the third protective layer 251 corresponding to the center of the first pixel electrode 210A, a thickness t5 of the second protective layer 252 corresponding to the center of the second pixel electrode 210B, and a thickness t6 of the third inorganic conductive layer 253 corresponding to the center of the third pixel electrode 210C may be substantially equal to each other. On the other hand, thicknesses of edge portions of the third protective layer 251, the second protective layer 252, and the third inorganic conductive layer 253 may vary depending on inclined surfaces of the pixel-defining layer 180 adjacent to the openings 181, 182, and 183.

Figure 12:
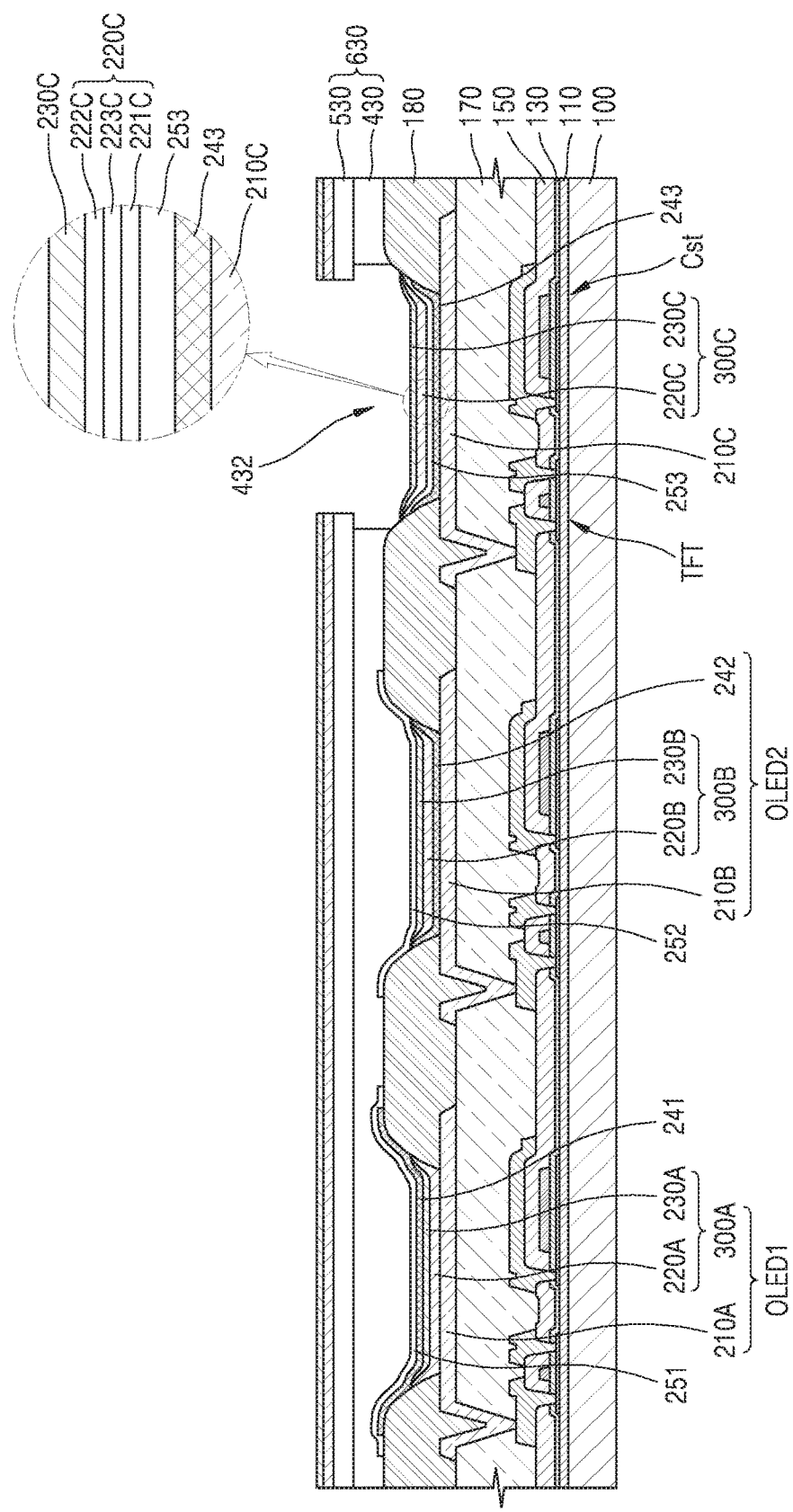

Referring to FIG. 12, a protective resin layer 430 is formed on the substrate 100 on which the second protective layer 252, the third inorganic conductive layer 253 and the third protective layer 251 are formed, and a photoresist layer 530 is formed on the protective resin layer 430. The protective resin layer 430 may include, for example, a fluorine-based material having a fluorine content of about 50 wt % or more, and the photoresist layer 530 may include a positive photosensitive material.

A third opening region may be formed by partially exposing and developing a region of the photoresist layer 530 overlapping the second pixel electrode 210B, and a third exposure hole 432 may be formed by etching the protective resin layer 430 exposed through the third opening region. The protective resin layer 430 including the third exposure hole 432 and the photoresist layer 530 may form a third masking pattern 630.

A third intermediate layer 220C and a third opposite electrode 230C are sequentially formed on the substrate 100 on which the third masking pattern 630 is formed. The third intermediate layer 220C and the third opposite electrode 230C may be formed by a thermal evaporation method, and a stack structure 300C (hereinafter referred to as a third stack) including the third intermediate layer 220C and the third opposite layer 230C may be formed on the third inorganic conductive layer 253 through the third exposure hole 432. The third intermediate layer 220C and the third opposite electrode 230C may also be formed on the third masking pattern 630.

The third intermediate layer 220C includes an emission layer 223C, as shown in an enlarged view of FIG. 12. The emission layer 223C may include a fluorescent material or a phosphorescent material capable of emitting light of a third color (e.g., blue). First and second functional layers 221C and 222C may be formed above and/or below the emission layer 223C. The first functional layer 221C may be a single layer of a hole transport layer (HTL), or may be a multilayer including a hole injection layer (HIL) and the hole transport layer (HTL). The second functional layer 222C may include an electron transport layer (ETL) and/or an electron injection layer (EIL). However, the second functional layer 222B may be omitted.

The third opposite electrode 230C may be formed as a transparent electrode, a semi-transparent electrode, or a reflective electrode, and the material of the third opposite electrode 230C is the same as that of the first opposite electrode 230A.

Figure 13:
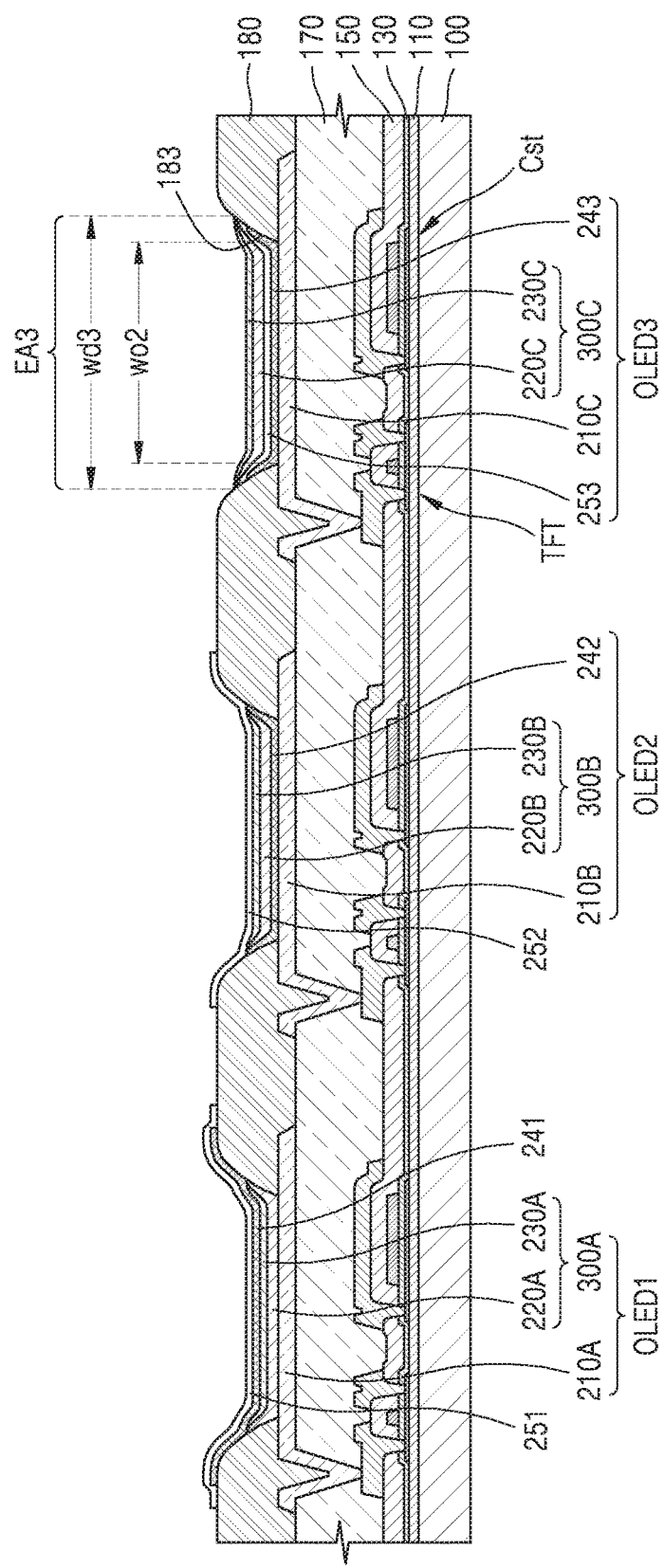

Referring to FIG. 13, the third masking pattern 630 shown in FIG. 12 is removed through a lift-off process. For example, the photoresist layer 530, the third intermediate layer 220C, and the third opposite electrode 230C, stacked on the protective resin layer 430 in FIG. 12, may be removed together by removing the protective resin layer 430 by using a fluorine-based solvent.

The third pixel electrode 210C, the second inorganic conductive layer 243, the third inorganic conductive layer 253, and the third stack 300C form a third organic light-emitting diode OLED3. Since the second inorganic conductive layer 243 and the third inorganic conductive layer 253 have conductivity, holes emitted from the third pixel electrode 210C may be injected into the third intermediate layer 220C. The holes injected from the third pixel electrode 210C and electrons injected from the common opposite electrode 260 (See FIG. 14) the third opposite electrode 230C are combined in the emission layer 223C of the third intermediate layer 220C and thus excitions are formed, and light of the third color may be emitted as the excitons drop from an excited state to a ground state. A third emission area EA3 where the light of the third color is emitted corresponds to a third sub-pixel.

Since the holes emitted from the third pixel electrode 210C are injected into the third intermediate layer 220C through the second inorganic conductive layer 243 and the third inorganic conductive layer 253, the second inorganic conductive layer 243 and the third inorganic conductive layer 253 may be a kind of additional pixel electrodes. Accordingly, the width of the third emission area EA3 of the third sub-pixel may be substantially equal to the width wd3 of the third inorganic conductive layer 253, which is wider than the width wo2 of the opening 183 of the pixel-defining layer 180 corresponding to the third sub-pixel. Therefore, by increasing the width wd3 of the third inorganic conductive layer 253 without increasing the width wo2 of the opening 183 of the pixel-defining layer 180 corresponding to the third sub-pixel, the width of the third emission area EA3 may be increased.

As described above, the first to third stacks 300A, 300B, and 300C are formed separately through lift-off processes, and the thicknesses of the first to third stacks 300A, 300B, and 300C may be equal to or different from each other. The thickness of the first inorganic conductive layer 242, the thickness of the second inorganic conductive layer 243, and the thickness of the third inorganic conductive layer 253 may be equal to or different from each other.

The first inorganic conductive layer 242 is interposed between the second pixel electrode 210B and the second oppose electrode 230B of the second organic light-emitting diode OLED2, and the second and third inorganic conductive layers 243 and 253 are interposed between the third pixel electrode 210C and the third opposite electrode 230C of the third organic light-emitting diode OLED3. Therefore, the distance between the first pixel electrode 210A and the first opposite electrode 230A of the first organic light-emitting diode OLED1, the distance between the second pixel electrode 210B and the second opposite electrode 230B of the second organic light-emitting diode OLED2, and the distance between the third pixel electrode 210C and the third opposite electrode 230C of the third organic light-emitting diode OLED3 may be different from each other, and a micro-cavity structure may be formed independently for each sub-pixel by adjusting the thicknesses of the first inorganic conductive layer 242, the second inorganic conductive layer 243, and the third inorganic conductive layer 253.

Figure 14:
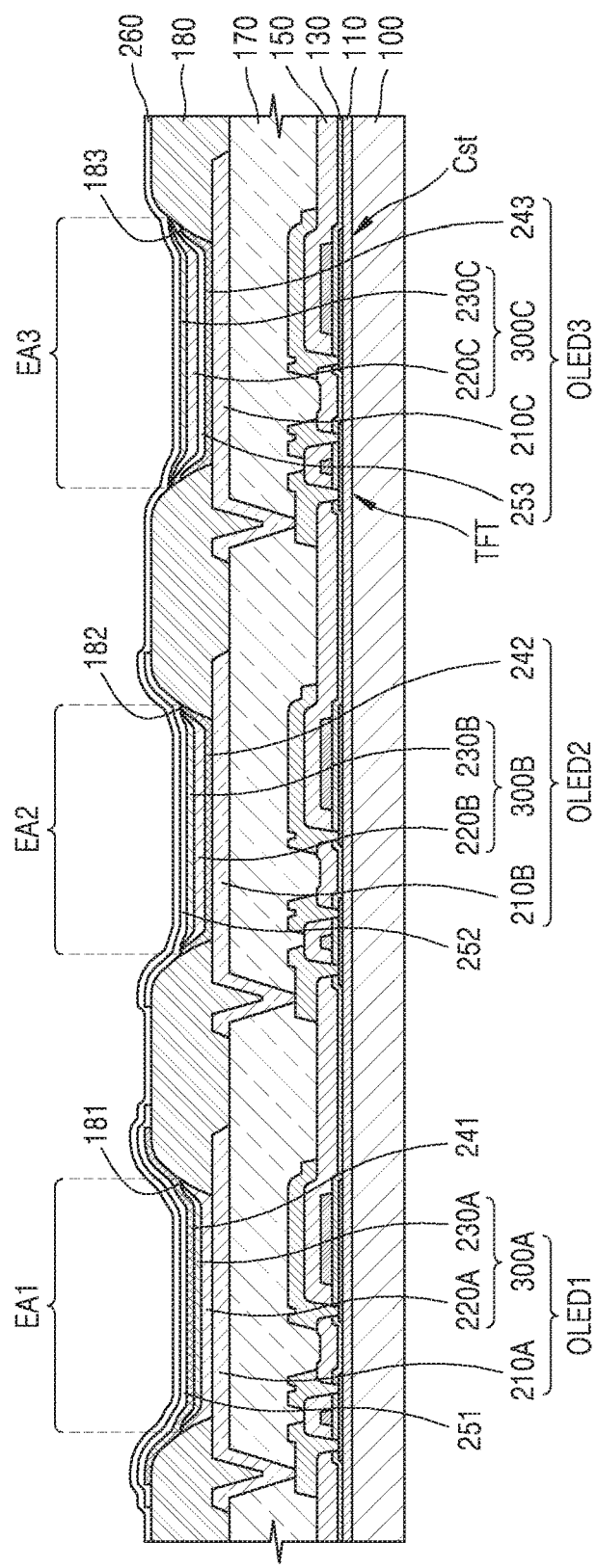

Referring to FIG. 14, the common opposite electrode 260 is formed. The common opposite electrode 260 may be formed as a transparent electrode, a semi-transparent electrode, or a reflective electrode. The common opposite electrode 260 may be the same type of electrode as the first to third opposite electrodes 230A, 230B and 230C. For example, when the first to third opposite electrodes 230A, 230B and 230C are transparent (or semi-transparent) electrodes, the common opposite electrode 260 may be a transparent (or semi-transparent) electrode. When the first to third opposite electrodes 230A, 230B and 230C are reflective electrodes, the common opposite electrode 260 may be a reflective electrode. When the common opposite electrode 260 is formed as a transparent (or semi-transparent) electrode, the common opposite electrode 260 may include a layer including Ag, Mg, Al, Yb, Ca, Li, Au, or a compound thereof, or may include a layer including a transparent (or semi-transparent) material such as ITO, IZO, ZnO, or $In_2O_3$. In an exemplary embodiment, the common opposite electrode 260 may include a metal thin film including Ag and Mg. When the common opposite electrode 260 is formed as a reflective electrode, the common opposite electrode 260 may include a layer including at least one of Li, Ca, LiF/Ca, LiF/Al, Al, Ag and Mg.

As shown in FIGS. 14 and 15, the common opposite electrode 260 may be electrically connected to the first through third stacks 300A, 300B, and 300C. The common opposite electrode 260 may electrically connect the first to third stacks 300A, 300B, and 300C independently arranged (or electrically isolated from each other) for each sub-pixel. For example, the common opposite electrode 260 may electrically connect the first to third opposite electrodes 230A, 230B and 230C of the first to third stacks 300A, 300B and 300C, and may apply a predetermined voltage to each of the first to third opposite electrodes 230A, 230B and 230C.

Referring to FIG. 15, the size of the first emission area EA1 may be substantially equal to that of the opening 181 of the pixel-defining layer 180 corresponding to the first emission area EA1, since the first stack 300A contacts the portion of the first pixel electrode 210A that is exposed by the opening 181. On the other hand, the size of the second emission area EA2 may be greater than that of the opening 182 of the pixel-defining layer 180 corresponding to the second emission area EA2, since the second stack 300B contacts the first inorganic conductive layer 242 that is wider than the opening 182 and provides holes. Also, the size of the third emission area EA3 may be greater than that of the opening 183 of the pixel-defining layer 180 corresponding to the third emission area EA3, since the third stack 300C contacts the third inorganic conductive layer 253 that is wider than the opening 183 and provides holes.

As shown in FIG. 16, the common opposite electrode 260 may contact a first electrode power supply line 10 on a peripheral area of the substrate 100, for example, on a non-display area NDA surrounding a display area DA that includes sub-pixels and realizes an image. The first electrode power supply line 10 supplies a first power supply voltage ELVSS to each sub-pixel through the common opposite electrode 260. A second power supply line 20 may be arranged in the non-display area NDA of the substrate 100, and the second power supply line 20 supplies a second power supply voltage ELVDD to each sub-pixel through interconnection lines.

A switching thin film transistor TFT2 of each sub-pixel transfers a data voltage input from a data line DL to a driving thin film transistor TFT1 according to a switching voltage input from a scanning line SL. A storage capacitor Cst may store a voltage corresponding to a difference between a voltage received from the switching thin film transistor TFT2 and the second power supply voltage ELVDD, and the driving thin film transistor TFT1 may control a driving current Id of an organic light-emitting diode OLED in response to a voltage value stored in the storage capacitor Cst. The organic light-emitting diode OLED may emit light having predetermined luminance, depending on the driving current Id.

In the illustrated embodiments, the first protective layer 241 is formed on the first stack 300A by etching the corresponding protective material layer 240 using the photoresist pattern 710A that is different from the first masking pattern 610 for forming the first stack 300A. Also, the second protective layer 252 is formed on the second stack 300B by etching the second protective material layer 250 using the photoresist pattern 710E that is different from the second masking pattern 620 for forming the second stack 300B. Accordingly, the first and second stacks 300A and 300B may be effectively protected. As a comparative example, if the first protective layer 241 is deposited using the first masking pattern 610 without removing the first masking pattern 610 after a thermal deposition process of forming the first stack 300A, deposition materials of the first stack 300A may be accumulated on the side (sidewall, side surface) of the first masking pattern 610 adjacent to the first exposure hole 412, and thus, as the manufacturing processes progress, the size of the first exposure hole 412 may gradually decrease. Since the first protective layer 241 deposited through a narrow first exposure hole 412 does not sufficiently cover the first stack 300A, the edge of the first stack 300A may be damaged in the subsequent manufacture processes, and thus, a dark spot may occur or light emission characteristics at the edge of an emission area may be degraded. However, according to the illustrated embodiments, since the first and second protective layers 241 and 252 are formed in separate processes after the first and second masking patterns 610 and 620 are removed, respectively, the first and second protective layers 241 and 252 may be formed to cover the first and second stacks 300A and 300B. Therefore, it is possible to prevent the first and second stacks 300A and 300B from being damaged in the subsequent manufacture processes, such as a lift-off process. In addition, since the widths of the first and second protective layers 241 and 252 may be adjusted so that the edges of the first and second protective layers 241 and 252 cover the upper surface of the pixel-defining layer 180, a contact area between the first and second protective layers 241 and 252 and the pixel-defining layer may be sufficiently secured.

An organic light-emitting display device manufactured through the above-described processes may prevent emission efficiency from being lowered at the edge of an emission area, as described above. Furthermore, by adjusting the widths of the first to third inorganic conductive layers 242, 243 and 253, the width of the emission area may be controlled (increased) regardless of the width of an opening of the pixel-defining layer 180. In addition, since the distance between the first pixel electrode 210A and the first opposite electrode 230A, the distance between the second pixel electrode 210B and the second opposite electrode 230C, and the distance between the third pixel electrode 210C and the third opposite electrode 230C may be independently controlled, high resolution images may be provided.

According to the embodiments described above, it is possible to prevent an organic light-emitting diode from being damaged in an organic light-emitting display device manufacturing process using a lift-off process and to prevent or minimize occurrence of a dark spot and non-uniform light emission of pixels. Obviously, the scope of the exemplary embodiments and appended claims are not limited to these effects.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An organic light-emitting display device comprising:
a first pixel electrode and a second pixel electrode;
a pixel-defining layer disposed on the first pixel electrode and the second pixel electrode and exposing at least portions of the first pixel electrode and the second pixel electrode;
a first stack disposed on the exposed portion of the first pixel electrode, the first stack comprising a first intermediate layer including an emission layer and a first opposite electrode disposed on the first intermediate layer;
a first protective layer disposed on the first stack;

a second stack disposed on the exposed portion of the second pixel electrode, the second stack comprising a second intermediate layer including an emission layer and a second opposite electrode disposed on the second intermediate layer; and a first inorganic conductive layer disposed between the second pixel electrode and the second stack.

2. The organic light-emitting display device of claim 1, wherein the first protective layer and the first inorganic conductive layer comprise the same material.

3. The organic light-emitting display device of claim 2, wherein each of the first protective layer and the first inorganic conductive layer comprises at least one of a conductive oxide film and a metal thin film.

4. The organic light-emitting display device of claim 1, wherein a width of the first protective layer is greater than a width of the first stack.

5. The organic light-emitting display device of claim 4, wherein an edge of the first protective layer contacts an upper surface of the pixel-defining layer.

6. The organic light-emitting display device of claim 1, wherein a width of the first inorganic conductive layer is equal to or greater than a width of an opening of the pixel-defining layer which exposes the second pixel electrode.

7. The organic light-emitting display device of claim 1, wherein an edge of the first inorganic conductive layer contacts an inclined surface of the pixel-defining layer, the inclined surface being adjacent to the exposed portion of the second pixel electrode.

8. The organic light-emitting display device of claim 7, wherein the edge of the first inorganic conductive layer is spaced apart from an edge of the second pixel electrode by the pixel-defining layer.

9. The organic light-emitting display device of claim 1, further comprising:
a third pixel electrode;
a third stack disposed on a portion of the third pixel electrode exposed by the pixel-defining layer, the third stack comprising a third intermediate layer including an emission layer and a third opposite electrode disposed on the third intermediate layer; and
at least one inorganic conductive layer disposed between the third pixel electrode and the third stack.

10. The organic light-emitting display device of claim 9, further comprising:
a second protective layer disposed on the second opposite electrode.

11. The organic light-emitting display device of claim 10, wherein the at least one inorganic conductive layer comprises a second inorganic conductive layer and a third inorganic conductive layer that are stacked on the third pixel electrode, and
wherein one of the second inorganic conductive layer and the third inorganic conductive layer includes the same material as the second protective layer.

12. The organic light-emitting display device of claim 11, wherein the other of the second inorganic conductive layer and the third inorganic conductive layer includes the same material as the first protective layer.

13. The organic light-emitting display device of claim 1, further comprising:
a common opposite electrode covering the first stack and the second stack.

14. An organic light-emitting display device comprising:
a first pixel electrode and a second pixel electrode;
a first stack disposed on the first pixel electrode, the first stack comprising a first intermediate layer including an emission layer and a first opposite electrode disposed on the first intermediate layer;
a second stack disposed on the second pixel electrode, the second stack comprising a second intermediate layer including an emission layer and a second opposite electrode disposed on the second intermediate layer;
a common opposite electrode disposed on the first stack and the second stack, the common opposite electrode electrically connecting the first opposite electrode to the second opposite electrode;
a first protective layer disposed between the first stack and the common opposite electrode, the first protective layer having a width greater than a width of the first stack; and
a first conductive layer disposed between the second pixel electrode and the second stack.

15. The organic light-emitting display device of claim 14, wherein the first conductive layer comprises an inorganic material.

16. The organic light-emitting display device of claim 14, wherein the first protective layer and the first conductive layer comprise the same material.

17. The organic light-emitting display device of claim 14, further comprising:
an insulating layer separating an edge of the first conductive layer from an edge of the second pixel electrode.

18. The organic light-emitting display device of claim 14, further comprising:
a second protective layer covering the second stack.

19. The organic light-emitting display device of claim 18, further comprising:
a third pixel electrode spaced apart from the first pixel electrode and the second pixel electrode;
a third stack disposed on the third pixel electrode, the third stack comprising a third intermediate layer including an emission layer and a third opposite electrode disposed on the third intermediate layer; and
at least one conductive layer between the third pixel electrode and the third stack.

20. The organic light-emitting display device of claim 19, wherein the at least one conductive layer comprises the same material as at least one of the first protective layer and the second protective layer.

* * * * *